(12) United States Patent
Choi

(10) Patent No.: US 7,764,097 B2
(45) Date of Patent: Jul. 27, 2010

(54) DUTY DETECTOR AND DUTY CYCLE CORRECTOR INCLUDING THE SAME

(75) Inventor: Young-don Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 53 days.

(21) Appl. No.: 12/292,908

(22) Filed: Dec. 1, 2008

(65) Prior Publication Data
US 2009/0140785 A1 Jun. 4, 2009

(30) Foreign Application Priority Data
Nov. 30, 2007 (KR) ...................... 10-2007-0123813

(51) Int. Cl.
H03K 3/017 (2006.01)
(52) U.S. Cl. .................. 327/175; 327/172; 327/298
(58) Field of Classification Search .............. 327/31, 327/33, 172–175, 291, 294, 298
See application file for complete search history.

(56) References Cited

U.S. PATENT DOCUMENTS 7,005,900 B1 * 2/2006 Nguyen ...................... 327/122

2006/0103441 A1 5/2006 Carpenter et al.

FOREIGN PATENT DOCUMENTS

| KR | 10-2004-0064862 | 7/2004 |
| KR | 10-2005-0006885 | 1/2005 |
| KR | 10-2006-0079581 | 7/2006 |

\* cited by examiner

*Primary Examiner*—An T Luu
(74) *Attorney, Agent, or Firm*—Harness, Dickey & Pierce, P.L.C.

(57) ABSTRACT

A duty detector includes a clock converter, a hold pulse generator, a first logic operator, and an up/down counter. The clock converter receives a clock signal to generate an up clock signal and a down clock signal having phases opposite to each other. The hold pulse generator generates a hold pulse signal that is deactivated during a counting interval corresponding to first through (N−1)-th period intervals of the clock signal and is activated during a holding interval corresponding to an N-th period interval. The first logic operator outputs a counting clock signal by performing a first logic operation on the hold pulse signal and a sampling clock signal. The up/down counter determines a logic level of the up clock signal and a logic level of the down clock signal at an edge timing of the counting clock signal, increases or decreases a counting value in response to the determination result, and outputs duty information of the clock signal, based on a final counting value.

21 Claims, 10 Drawing Sheets

DUTY DETECTOR AND DUTY CYCLE CORRECTOR INCLUDING THE SAME

PRIORITY STATEMENT

This application claims the benefit of Korean Patent Application No. 10-2007-0123813, filed on Nov. 30, 2007, in the Korean Intellectual Property Office, the disclosure of which is incorporated herein in its entirety by reference.

1. Background

Example embodiments relate to a duty detector and a duty cycle corrector including the same, and more particular to a duty detector detecting duty information of a clock signal using a sampling clock signal, and a duty cycle corrector including the duty detector.

2. Description of the Related Art

In many systems including semiconductor memories, since a duty cycle of a clock signal has an influence on the system operation, it may be necessary to adjust the duty cycle of the clock signal to a desired ratio. A duty cycle of a clock signal represents a ratio of a high level versus a low level during one period interval of a clock signal. A duty cycle of less than or more than 50% may be used for special purposes, but a duty cycle of 50% may be used in most cases. A duty cycle corrector (DCC) may be used to adjust and maintain a duty cycle of a clock signal to being a required ratio.

FIG. 1 is a block diagram of a related art DCC.

Referring to FIG. 1, the DCC 100 includes a duty steerer 110 and a duty detector 120. The duty detector 120 detects duty information of an output clock signal CK_out, and outputs a duty control signal Sc corresponding to the detected duty information to the duty steerer 110. The duty steerer 110 adjusts a duty cycle of an input clock signal CK_in in response to the duty control signal Sc, and outputs the adjusted clock signal as the output clock signal CK_out.

As the operating speed of semiconductor memories increases, the period of a clock signal shortens. The shortened period of the clock signal may make it more difficult to adjust and maintain the duty cycle of the clock signal to a desired duty ratio. This is because, as the period of the clock signal is shortened, the duty cycle of the clock signal must be adjusted more finely.

SUMMARY

Example embodiments provide a duty detector, which is capable of more finely detecting duty information of a clock signal using a sampling clock signal, and a duty cycle corrector including the duty detector.

According to example embodiments, there is provided a duty detector, including a clock converter, a hold pulse generator, a first logic operator, and/or an up/down counter. The clock converter receives a clock signal to generate an up clock signal and a down clock signal having phases opposite to each other. The hold pulse generator generates a hold pulse signal that is deactivated during a counting interval corresponding to first through (N−1)-th period intervals of the clock signal and is activated during a holding interval corresponding to an N-th period interval. The first logic operator outputs a counting clock signal by performing a first logic operation on the hold pulse signal and a sampling clock signal. The up/down counter determines a logic level of the up clock signal and a logic level of the down clock signal at an edge timing of the counting clock signal, increases or decreases a counting value in response to the determination result, and outputs duty information of the clock signal based on a final counting value.

A frequency of the sampling clock signal may be higher than that of the clock signal.

The frequency of the sampling clock signal need not be an integer multiple of the frequency of the clock signal.

The up/down counter may increase or decrease the counting value during the counting interval, and output the duty information of the clock signal at the holding interval based on the final counting value.

The up/down counter may increase the counting value when the up clock signal is at a first logic level at the edge timing of the counting clock signal, and decrease the counting value when the down clock signal is at the first logic level at the edge timing of the counting clock signal.

The up/down counter may determine the logic level of the up clock signal and the logic level of the down clock signal at a rising edge timing of the counting clock signal.

The duty detector may further include a delayer delaying the hold pulse signal by a certain time to output an update signal. The up/down counter may output the duty information of the clock signal in response to an activation of the update signal at the holding interval.

The duty detector may further include a second logic operator outputting a reset signal by performing a second logic operation on the clock signal and the hold pulse signal. The up/down counter may reset the counting value in response to an activation of the reset signal at the holding interval.

The up/down counter may output a sign of the final counting value as the duty information of the clock signal. The up/down counter may output the final counting value as the duty information of the clock signal.

The duty detector may further include a register storing the duty information of the clock signal, and outputting a digital steer code for adjusting a duty cycle of the clock signal based on the stored duty information.

According to example embodiments, there is provided a duty detector, including: a clock converter receiving a clock signal to generate an up clock signal and a down clock signal having phases opposite to each other; a hold pulse generator generating a hold pulse signal that is deactivated during a counting interval corresponding to first through (N−1)-th period intervals of the clock signal and is activated during a holding interval corresponding to an N-th period interval; a first operator outputting a first counting clock signal by performing a logic operation on the hold pulse signal and a first sampling clock signal; a first up/down counter outputting a first duty information of the clock signal by counting a logic level of the up clock signal and a logic level of the down clock signal at an edge timing of the first counting clock signal; a second operator outputting a second counting clock signal by performing a logic operation on the hold pulse signal and a second sampling clock signal; and a second up/down counter outputting a second duty information of the clock signal by counting a logic level of the up clock signal and a logic level of the down clock signal at an edge timing of the second counting clock signal.

The duty detector may further include an adder adding the first duty information and the second duty information of the clock signal and outputting the added duty information.

According to example embodiments, there is provided a duty cycle corrector, including: a duty steerer adjusting a duty cycle of an input clock signal in response to duty information to output a clock signal; a sampling clock generator generating a sampling clock signal corresponding to a control signal; a duty detector detecting a duty information of the clock signal using the sampling clock signal, wherein the duty detector includes: a clock converter receiving the clock signal to generate an up clock signal and a down clock signal having phases opposite to each other; a hold pulse generator generating a hold pulse signal that is deactivated during an interval corresponding to {[(m−1)×N]+1}-th through (m×N−1)-th period intervals of the clock signal and is activated during an interval corresponding to an (m×M)-th period interval; a first logic operator outputting a counting clock signal by performing a first logic operation on the hold pulse signal and the sampling clock signal; and an up/down counter outputting the duty information of the clock signal by counting a logic level of the up clock signal and a logic level of the down clock signal at an edge timing of the counting clock signal.

The sampling clock generator may include: an amp buffering the control signal; a shifter shifting an output signal of the amp by a certain delta; and a voltage controlled oscillator outputting the sampling clock signal having a frequency corresponding to an output signal of the shifter. The shifter may set the delta such that a frequency of the sampling clock signal is not an integer multiple of a frequency of the clock signal.

BRIEF DESCRIPTION OF THE DRAWINGS

The above and other features and advantages of example embodiments will become more apparent by describing them in detail with reference to the attached drawings in which.

DETAILED DESCRIPTION OF EXAMPLE EMBODIMENTS

Figure 1:
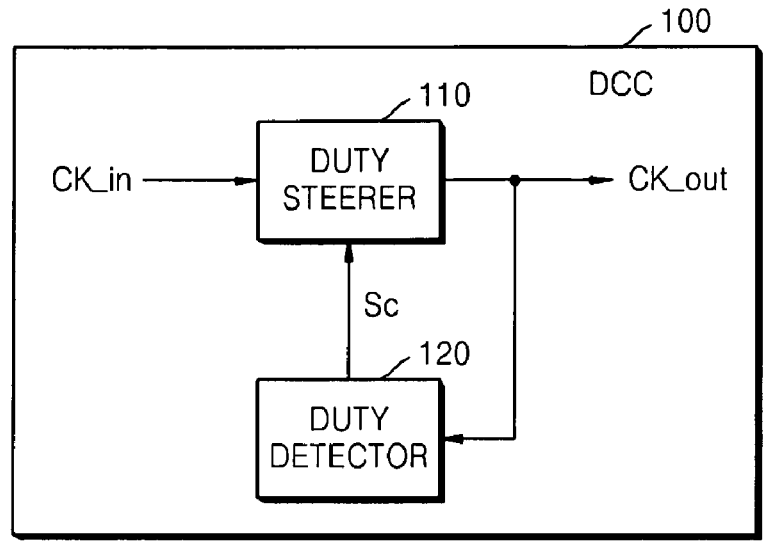
FIG. 1 is a general block diagram of a related art DCC.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions are exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 2:
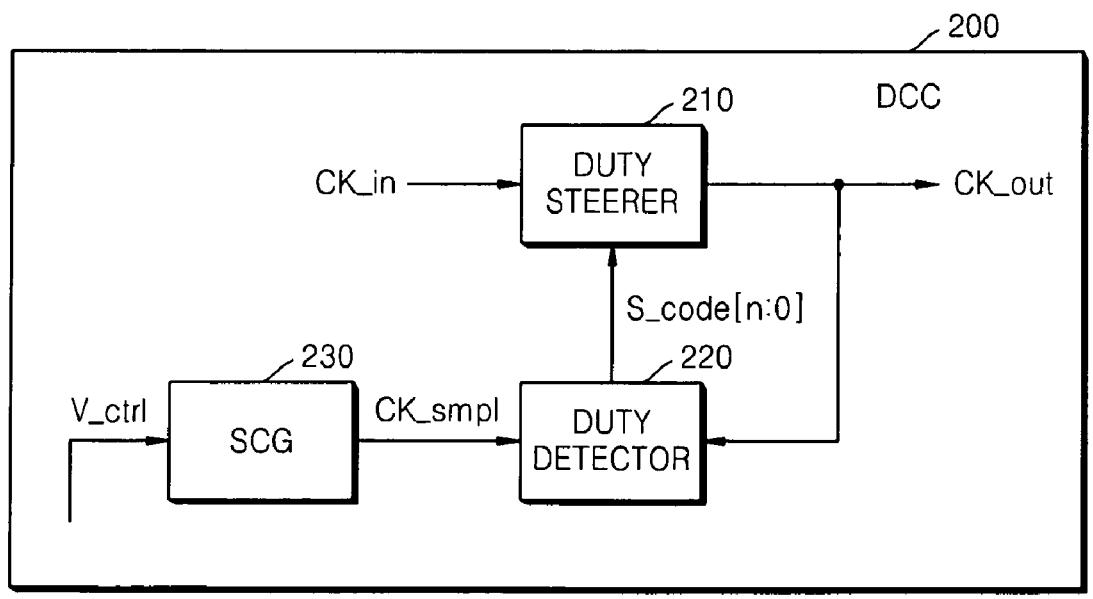
FIG. 2 is a block diagram of a DCC according to example embodiments.

FIG. 2 is a block diagram of a duty clock corrector (DCC) according to example embodiments. Referring to FIG. 2, the DCC 200 includes a duty steerer 210, a duty detector 220, and/or a sampling clock generator (SCG) 230.

The sampling clock generator 230 generates a sampling clock signal CK_smpl corresponding to a control signal V_ctrl, and outputs the generated sampling clock signal CK_smpl to the duty detector 220. A detailed operation of the sampling clock generator 230 will be described later in detail with reference to FIG. 8.

The duty detector 220 detects duty information of the output clock signal CK_out using the sampling clock signal CK_smpl. The duty detector 220 outputs the detected duty information or a digital steer code S_code [n:0] corresponding to the detected duty information to the duty steerer 210. A detailed operation of the duty detector 220 will be described later in detail with reference to FIGS. 3A through 7.

The duty steerer 210 steers a duty cycle of an input clock signal CK_in in response to the duty information or the digital steer code S_code[n:0], which is output from the duty detector 220, and outputs an output clock signal CK_out as the steered clock signal. A detailed operation of the duty steerer 210 will be described later in detail with reference to FIG. 9.

Figure 3A:
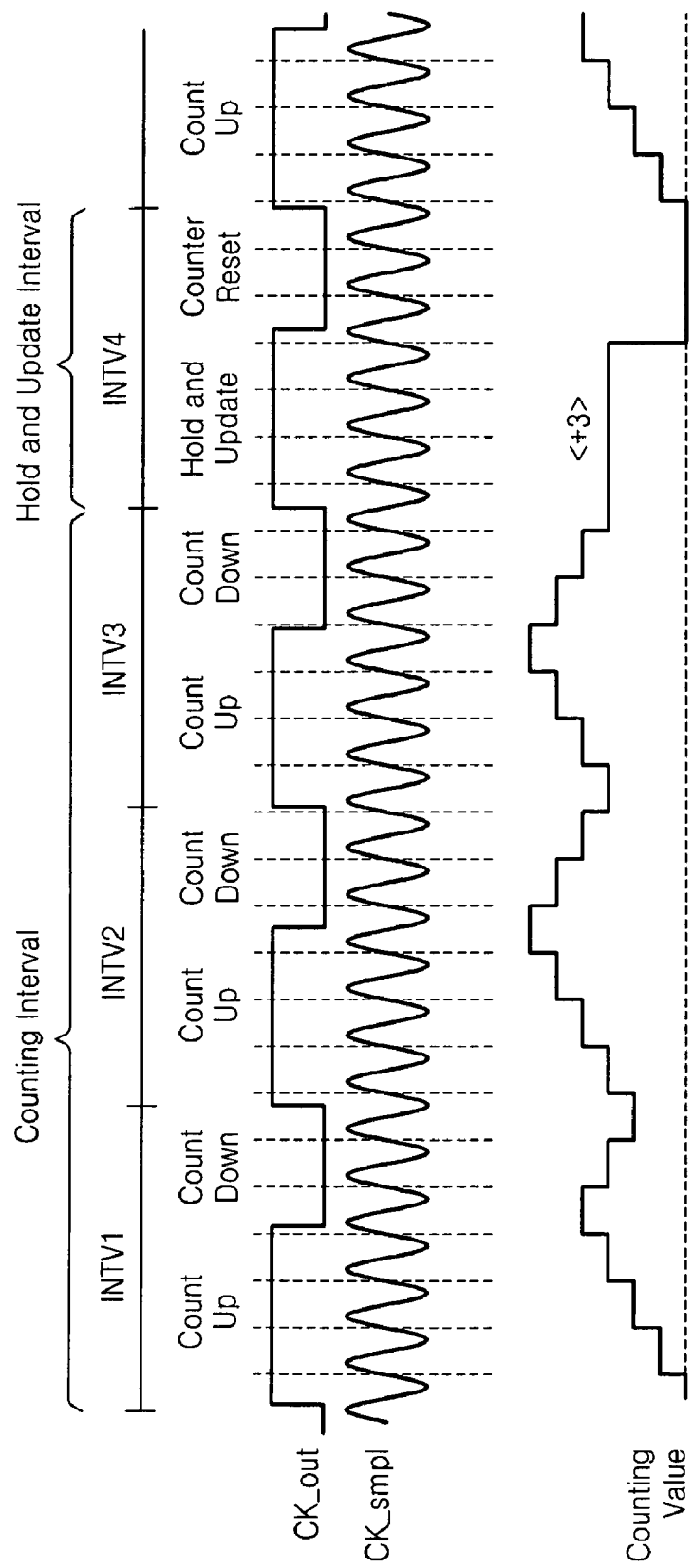
FIGS. 3A and 3B are example waveform diagrams illustrating the operation of detecting duty information of an clock signal (CK_out) using a sampling clock signal.
Figure 3B:
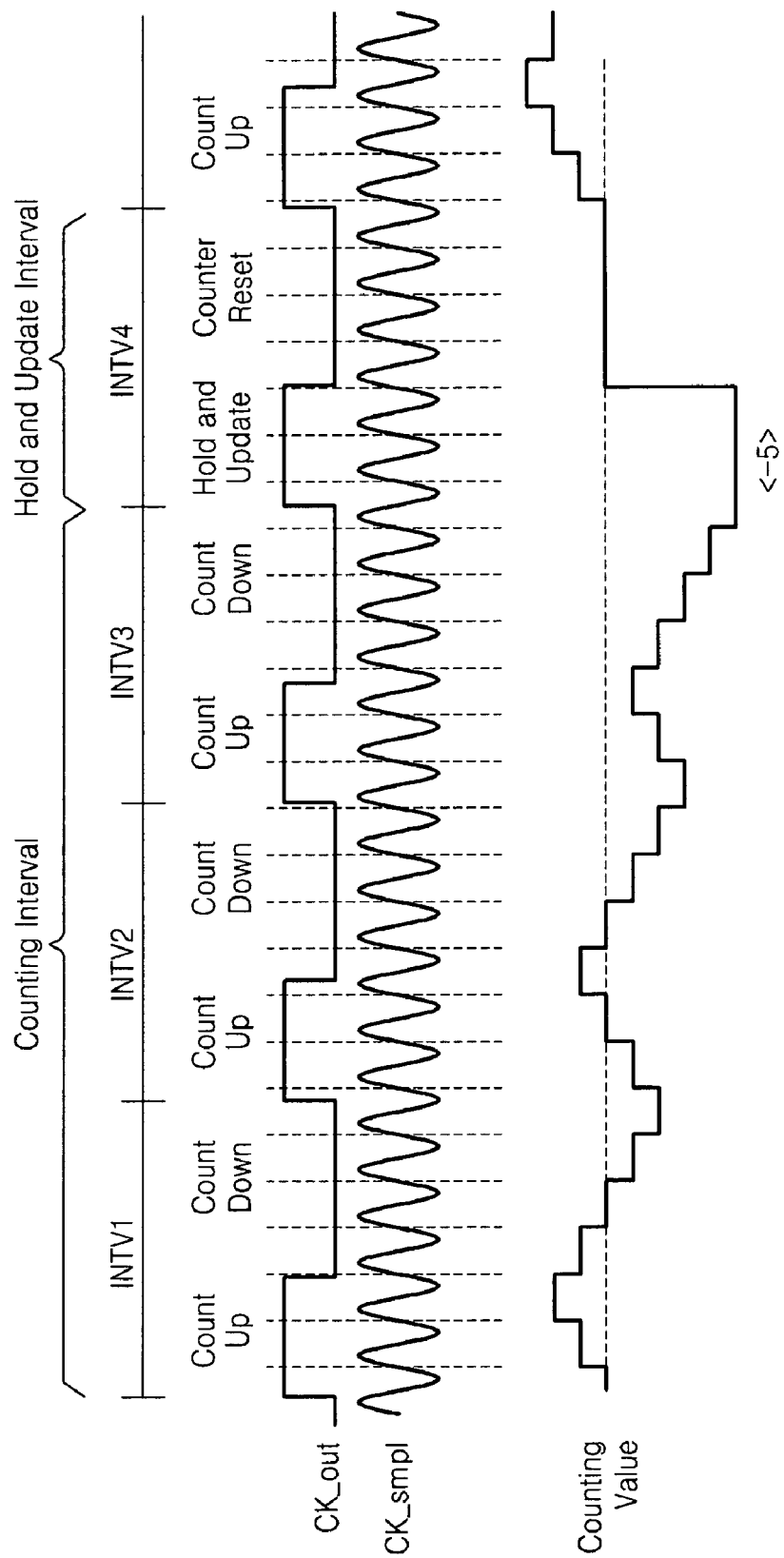

FIGS. 3A and 3B are waveform diagrams illustrating the operation of detecting the duty information of the output clock signal CK_out using the sampling clock signal CK_smpl at the duty detector 220 of FIG. 2.

For example, FIG. 3A illustrates a case where the duty cycle of the output clock signal CK_out is more than 50%. Referring to FIG. 3A, during first through third period intervals INTV1-INTV3 of the output clock signal CK_out, which may collectively be referred to as a counting interval, a counting value increases when the output clock signal CK_out has a logic high level at a rising edge timing of the sampling clock signal CK_smpl, and the counting value decreases when the output clock signal CK_out has a logic low level at a rising edge timing of the sampling clock signal CK_smpl. At a fourth period interval INTV4 of the output clock signal CK_out, which may be referred to as a hold and update interval, a final counting value (+3 in FIG. 3A) is output as the duty information of the output clock signal CK_out, and then the counting value is reset to zero. During fifth through seventh period intervals (not shown) of the output clock signal CK_out, the counting operation of the next counting interval is resumed. During an eighth period interval (also, not shown) of the output clock signal CK_out, a hold and updating operation of the hold and update interval is resumed. By repeating these operations, the duty information of the output clock signal CK_out is updated at every four period intervals of the output clock signal CK_out.

Although example embodiments in which the duty information of the output clock signal CK_out is updated at every four period intervals is illustrated in FIG. 3, example embodiments are not limited to this. For example, the duty information of the output clock signal CK_out may be updated every N period intervals of the output clock signal CK_out. In this case, the counting operation is performed at an {[(m−1)×N]+1}-th period interval through an {(m×N)−1}-th of the output clock signal CK_out, and the updating operation is performed at an (m×M)-th period interval of the output clock signal CK_out. Herein, N and m are natural numbers. The case where the duty information of the output clock signal CK_out is detected based on the counting value accumulated during the N period intervals can detect the duty information of the output clock signal CK_out more accurately than the case where the duty information of the output clock signal CK_out is detected by measuring only one period interval of the output clock signal CK_out.

FIG. 3B illustrates a case where the duty cycle of the output clock signal CK_out is less than 50%. In a manner similar to the case of FIG. 3A, the counting value is increased or decreased according to the logic level of the output clock signal CK_out at the rising edge timing of the sampling clock signal CK_smpl during the first through third period intervals INTV1-INTV3 of the output clock signal CK_out. At the fourth period interval INTV4 of the output clock signal CK_out, the held final counting value (−5 in FIG. 3B) is output as the duty information of the output clock signal CK_out and the counting value is then reset to zero. Likewise, the counting operation is resumed during the fifth through seventh period intervals (not shown) of the output clock signal CK_out, and the updating operation is resumed during the eighth period interval (not shown) of the output clock signal CK_out. By repeating these operations, the duty information of the output clock signal CK_out is updated at every four period intervals of the output clock signal CK_out.

As can be seen from FIGS. 3A and 3B, the duty detector according to example embodiments detects the duty information of the output clock signal CK_out using the sampling clock signal CK_smpl having a frequency higher than that of the output clock signal CK_out. That is, the duty detector determines the logic level of the output clock signal CK_out at the edge timing of the sampling clock signal CK_smpl and increases or decreases the counting value according to the determination result. As the frequency of the sampling clock signal CK_smpl increases, the counting operation may be performed more finely. Thus, the resolution of the duty detector can be improved by increasing the frequency of the sampling clock signal CK_smpl. The following description will be made about the improvement in the resolution of the duty detector using the sampling clock signal CK_smpl having a non-harmonic or harmonic relationship with the output clock signal CK_out with reference to FIGS. 4A and 4B.

Figure 4A:
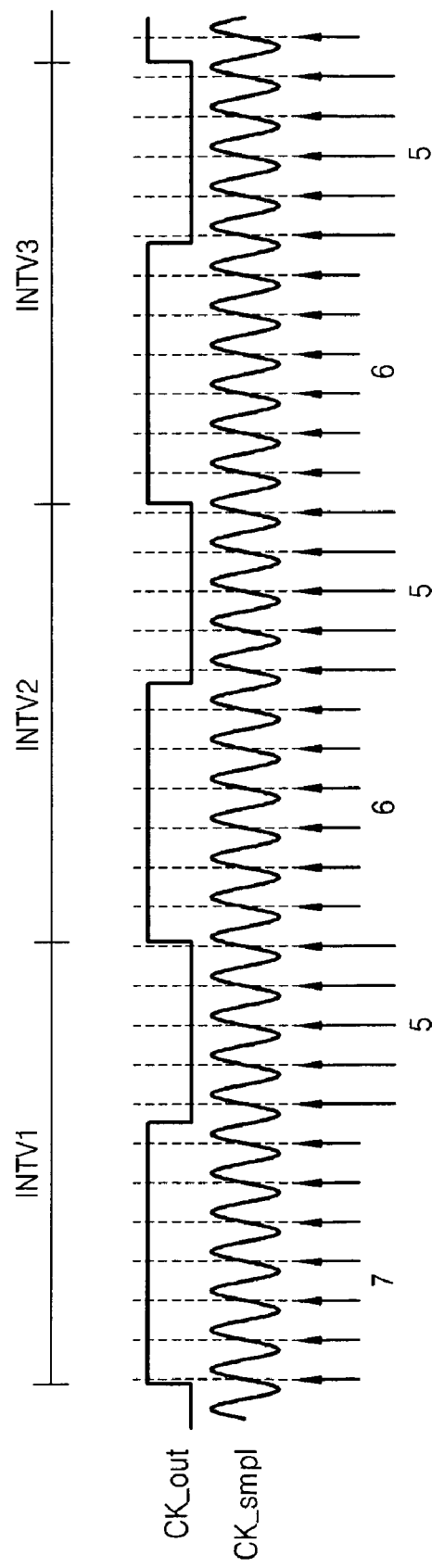
FIG. 4A is an example waveform diagram illustrating the output clock signal (CK_out) and the sampling clock signal (CK_smpl) having a non-harmonic relationship with each other.
Figure 4B:
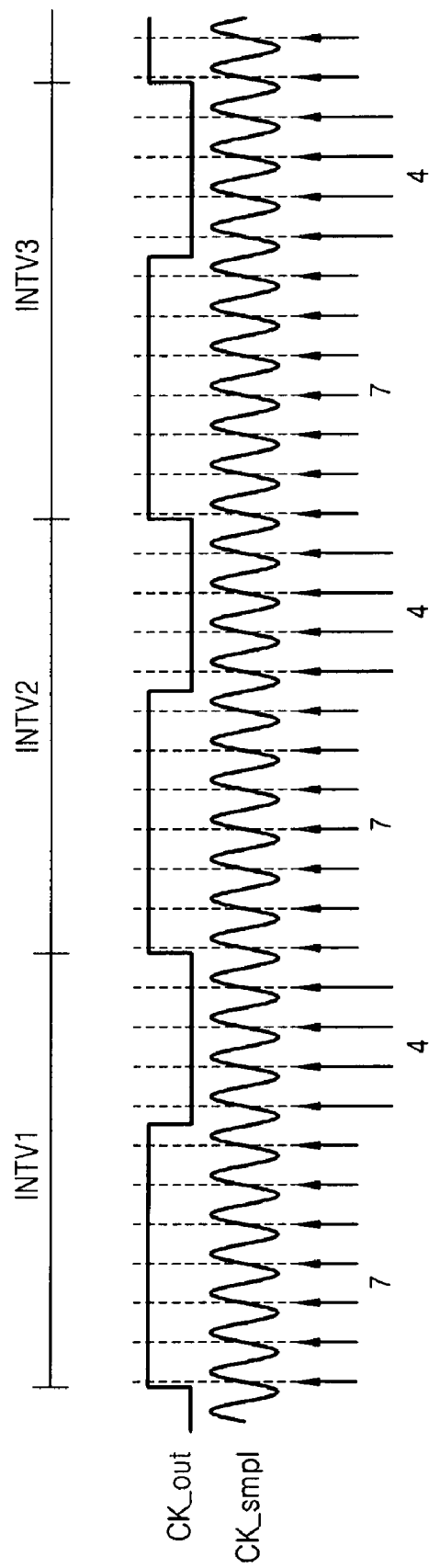
FIG. 4B is a waveform diagram illustrating the output clock signal (CK_out) and the sampling clock signal (CK_smpl) having a harmonic relationship with each other.

FIG. 4A is an example waveform diagram illustrating the output clock signal CK_out and the sampling clock signal CK_smpl having a non-harmonic relationship with each other. FIG. 4B is an example waveform diagram illustrating the output clock signal CK_out and the sampling clock signal CK_smpl having a harmonic relationship with each other.

Referring to FIG. 4B, when the output clock signal CK_out and the sampling clock signal CK_smpl have the harmonic relationship with each other, the frequency of the sampling clock signal CK_smpl is an integer multiple of the frequency of the output clock signal CK_out. In this case, the number of times of the up-counting operation on the output clock signal CK_out is identical at each period interval of the output clock signal CK_out, and the number of times of the down-counting operation on the output clock signal CK is also identical at each period interval of the output clock signal CK_out. For example, at first, second and third period intervals INTV1-INTV3 of the output clock signals CK_out in FIG. 4B, the up-counting operation is performed seven times and the down-counting operation is performed four times. Therefore, in the case of FIG. 4B, a mean number of times of the up-counting operation at the first through third period intervals INTV1-INTV3 of the output clock signal CK_out is seven and a mean number of times of the down-counting operation at the first through third period intervals of the output clock signal CK_out is four. Since the frequency of the sampling clock signal CK_smpl is an integer multiple of the frequency of the output clock signal CK_out, the mean number of times of the up-counting operation will be always seven and the mean number of times of the down-counting operation will be always four, even though the counting time is set to be longer.

Referring to FIG. 4A, when the output clock signal CK_out and the sampling clock signal CK_smpl have a non-harmonic relationship with each other, the frequency of the sampling clock signal CK_smpl is not an integer multiple of the frequency of the output clock signal CK_out. In this case, the number of times of the up-counting operation on the output clock signal CK_out may be different at each period interval of the output clock signal CK_out. For example, in FIG. 4A, the number of times of the up-counting operation is seven at the first period interval INTV1 of the output clock signal CK_out, but is six at the second and third period intervals INTV2-INTV3 of the output clock signal CK_out. In the case of FIG. 4A, a mean number of times of the up-counting operation is about 6.33 at the first through third period intervals INTV1-INTV3 of the output clock signal CK_out. If the counting interval is set to be longer, the mean number of times of the up-counting operation will obtain finer duty information of the output clock signal CK_out.

Although FIG. 4A shows the case where the number of times of the down-counting operation on the output clock signal CK_out is identical in each period interval INTV1-INTV3 of the output clock signal CK_out, the number of times of the down-counting operation on the output clock signal CK_out may also be different at each period interval INTV1-INTV3 of the output clock signal CK_out when the output clock signal CK_out and the sampling clock signal CK_smpl have a non-harmonic relationship.

As described above, the resolution of the duty detector may be increased by increasing the frequency of the sampling clock signal CK_smpl, and the resolution of the duty detector may be relatively increased using a sampling clock signal CK_smpl having a non-harmonic relationship with the output clock signal CK_out.

Figure 5:
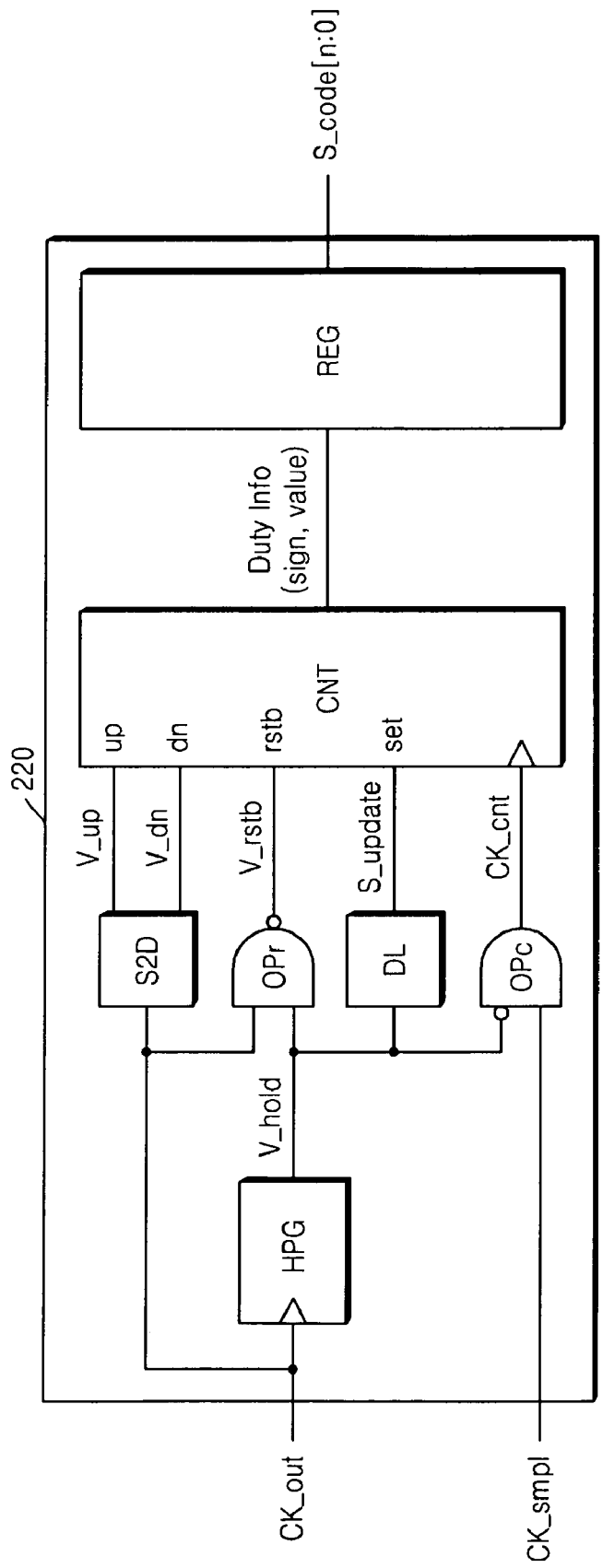
FIG. 5 is a block diagram of a duty detector according example embodiments.

FIG. 5 is a block diagram of a duty detector according to example embodiments.

Referring to FIG. 5, the duty detector 220 includes a clock converter S2D, a hold pulse generator HPG, a first logic operator Opc, a second logic operator Opr, an up/down-counter CNT, a delayer DL and/or a register REG.

Figure 6:
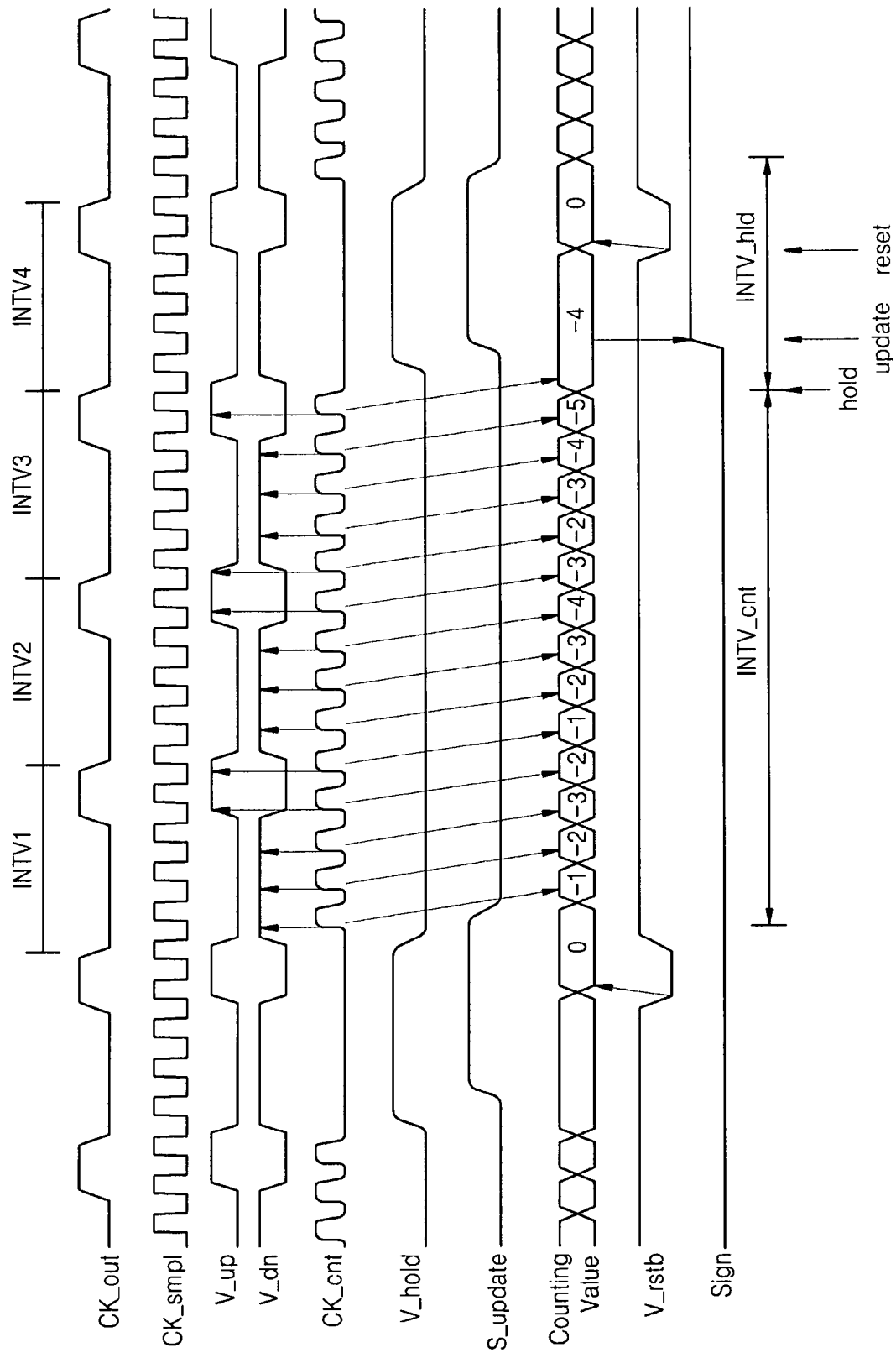
FIG. 6 is an example timing diagram of signals used in the duty detector of FIG. 5.

FIG. 6 is an example timing diagram showing signals used in the duty detector of FIG. 5.

For example, FIG. 6 shows an output clock signal CK_out, a sampling clock signal CK_smpl, an up clock signal V_up, a down clock signal V_dn, a counting clock signal CK_cnt, a hold pulse signal V_hold, an update signal S_update, a counting value, a reset signal V_rstb, and a sign of a counting value output as duty information.

An operation of the duty detector according to example embodiments will now be described with reference to FIGS. 5 and 6.

The clock converter S2D receives the output clock signal CK_out to generate the up clock signal V_up and the down clock signal V_dn having phases opposite to each other. The clock converter S2D of FIG. 5 may be a single-to-differential converter in the sense that two differential-ended signals with opposite phases are generated from the single-ended signal.

The hold pulse generator HPG generates the hold pulse signal V_hold that is deactivated during the counting interval INTV_cnt corresponding to the first through third period intervals INTV1 through INTV3 of the output clock signal CK_out and is activated during the holding interval INTV_hld corresponding to the fourth period interval INTV4. For further generalization, the hold pulse generator HPG generates the hold pulse signal V_hold that is deactivated during the counting interval INTV_cnt corresponding to the $\{[(m-1)\times N]+1\}$-th through $\{(m\times N)-1\}$-th period intervals and is activated during the holding interval INTV_hld corresponding to the $(m\times N)$-th period interval. Herein, m and N are natural numbers. The embodiment of N=4 is illustrated in FIG. 6. When N=4, the duty information of the output clock signal CK_out is updated at every four period intervals of the output clock signal CK_out.

The first logic operator Opc performs a first logic operation on the hold pulse signal V_hold and the sampling clock signal CK_smpl to output the counting clock signal CK_cnt. As illustrated in FIG. 5, when an AND operation is performed on an inversion signal of the hold pulse signal V_hold and the sampling clock signal CK_smpl, the counting clock signal CK_cnt is toggled only at the counting interval INTV_cnt and held at a low level at the holding interval INTV_hld. The counting clock signal CK_cnt of FIG. 6 can also be generated using other logic operations. By using the counting clock signal CK_cnt generated based on the hold pulse signal V_hold and the sampling clock signal CK_smpl, the counting operation may be performed at the counting interval INTV_cnt and the updating operation may be performed at the holding interval INTV_hld.

The up/down counter CNT determines a logic level of the up clock signal V_up and a logic level of the down clock signal V_dn at the edge timing of the counting clock signal CK_cnt. Then, the up/down counter CNT increases or decreases a counting value in response to the determination result, and outputs the duty information of the output clock signal CK_cnt based on the final counting value. For example, the up/down counter CNT increases the counting value when the logic level of the up clock signal V_up is at a first logic level (e.g., a high level) at the edge timing of the counting clock signal CK_cnt, and decreases the counting value when the logic level of the down clock signal V_dn is at the first logic level at the edge timing of the counting clock signal CK_cnt. The logic levels of the up clock signal V_up and the down clock signal V_dn may be determined at the rising edge timing of the counting clock signal CK_cnt, as illustrated in FIG. 6, and they may also be determined at the falling edge timing of the counting clock signal CK_cnt.

As illustrated in FIG. 6, the logic level of the up clock signal V_up and the logic level of the down clock signal V_dn during the counting interval INTV_cnt are counted. During the first period interval INTV1 of the output clock signal CK_out, the counting value decreases from 0 to −1, −2, and −3 when the logic level of the down clock signal V_dn is at a high level, and it increase from −3 to −2 and −1 when the logic level of the up clock signal V_up is at a logic high level. The final counting value becomes −4 when the counting operation is performed until the second and third period intervals INTV2 and INTV3 of the output clock signal CK_out.

The up/down counter CNT outputs the duty information of the output clock signal CK_out at the holding interval INTV_hld, based on the final counting value (−4 in FIG. 6). As illustrated in FIG. 5, the up/down counter CNT may output the final counting value itself as the duty information of the output clock signal CK_out, or may output the sign of the final counting value as the duty information DutyInfo of the output clock signal CK_out.

The output timing of the duty information DutyInfo may be controlled by a delayer DL. The delayer DL outputs an update signal S_update by delaying the hold pulse signal V_hold by a certain time. Since there is a time difference between the hold pulse signal V_hold and the update signal S_update, as shown in FIG. 6, the update signal S_update is activated every (m×N)-th period interval, just like the hold pulse signal V_hold. The up/down counter CNT outputs the duty information DutyInfo of the output clock signal CK_out at the holding interval INTV_hld in response to the activation of the update signal S_update. Since the update signal S_update is activated at every (m×N)-th period interval, the up/down counter CNT may update the duty information of the output clock signal CK_out at every (m×N)-th period interval. In FIG. 6, the sign of the final counting value "−4" is output as the duty information of the output clock signal CK_out at the activation time point of the update signal S_update.

The duty detector 220 according to example embodiments may further include a second logic operator Opr outputting a reset signal V_rstb by performing a second logic operation on the output clock signal CK_out and the hold pulse signal V_hold. Referring to FIG. 5, the second logic operator Opr outputs the reset signal V_rstb by performing a NAND operation on the output clock signal CK_out and the hold pulse signal V_hold. The up/down counter CNT resets the counting value at the holding interval INTV_hld in response to the activation of the reset signal V_rstb. The counting value is reset to zero when the reset signal V_rstb is activated to a logic low level at the holding interval INTV_hld.

As can be seen from FIG. 5, the duty detector according to example embodiments may further include a register REG storing the duty information DutyInfo of the output clock signal CK_out. The register REG outputs a digital steer code S_code[n:0] for adjusting a duty cycle of the output clock signal CK_out, based on the stored duty information Duty-Info. The duty steerer 210 of FIG. 2 may adjust the duty cycle of the input clock signal CK_in in response to the digital steer code S_code[n:0] output from the register REG, or may adjust the duty cycle of the input clock signal CK_in in response to the duty information DutyInfo output from the up/down counter CNT. When the duty detector 220 includes the register REG, the duty cycle of the input clock signal CK_in can be rapidly corrected using the duty information DutyInfo stored in the register REG when the system including the DCC 200 is powered off and then powered on, or when the duty cycle is re-locked.

As illustrated in FIG. 5, since the duty detector according to example embodiments is implemented with a digital circuit, the DCC 200 can be referred to as a digital-DCC. An analog-DCC may be implemented with analog components such as an integrator, a comparator, and a charge pump. Offset or leakage characteristics exist in the analog components such as the integrator, the comparator, and the charge pump. These offset or leakage characteristics may cause a correction error in the operation of the analog-DCC. However, since the duty detector 220 according to example embodiments is implemented with a digital circuit, the duty detector 220 may reduce or prevent the correction error caused by the offset or leakage characteristics.

Figure 7:
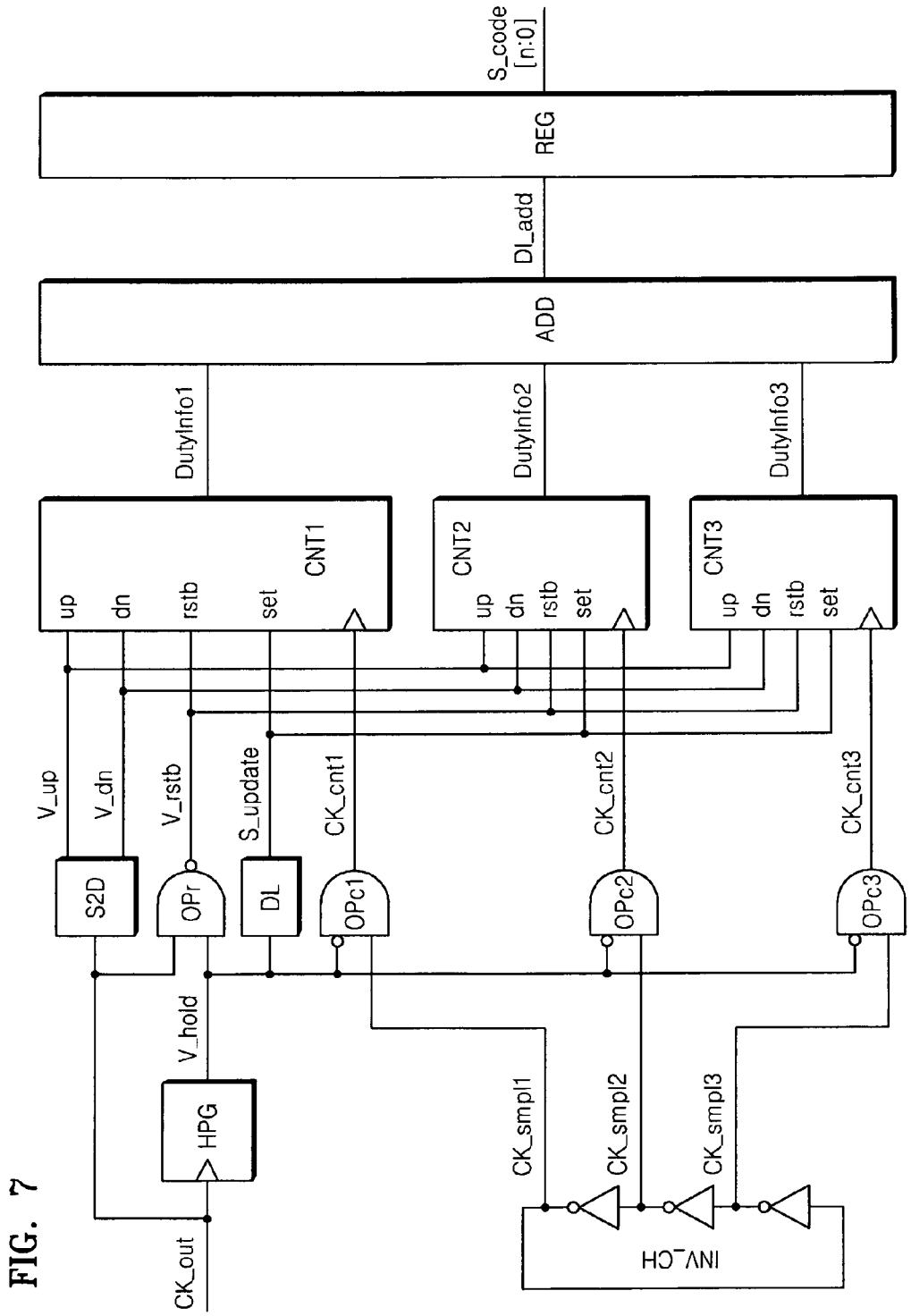
FIG. 7 is a block diagram of a duty detector according to example embodiments.

FIG. 7 is a block diagram of a duty detector according to example embodiments.

Referring to FIG. 7, the duty detector includes a clock converter S2D, a hold pulse generator HPG, a first logic operator OPc1, a first up/down counter CNT1, a second logic operator OPc2, a second up/down counter CNT2, a third logic operator OPc3, a third up/down counter CNT3, a delayer DL, a fourth logic operator OPr, an adder ADD, and/or a register REG. S2D, HPG, OPr, DL, and REG of FIG. 7 correspond to those of FIG. 5. An inverter chain INV_CH is further illustrated in FIG. 7. The inverter chain INV_CH may correspond to the sampling clock generator 230 in FIG. 2.

The inverter chain INV_CH may be implemented using a delay line of a delay-locked loop (DLL) or a phase-locked loop (PLL) that may be used in the system with the DCC 200. The inverter chain INV_CH outputs first through third sampling clock signals CK_smpl1 through CK_smpl3 having frequencies higher than the frequency of the output clock signal CK_out.

The first logic operator OPc1 outputs a first counting clock signal CK_cnt1 by performing a logic operation on the hold pulse signal V_hold and the first sampling clock signal CK_smpl1. In FIG. 7, the first logic operator OPc1 outputs the first counting clock signal CK_cnt1 by performing an AND operation on an inversion signal of the hold pulse signal V_hold and the first sampling clock signal CK_Smpl1. The first up/down counter CNT1 outputs a first duty information Duty_Info1 of the output clock signal CK_out by counting the logic level of the up clock signal V_up and the down clock signal V_dn at the edge timing of the first counting clock signal CK_cnt1.

The second logic operator OPc2 outputs a second counting clock signal CK_cnt2 by performing a logic operation on the hold pulse signal V_hold and the second sampling clock signal CK_smpl2. In FIG. 7, the second logic operator OPc2 outputs the second counting clock signal CK_cnt2 by performing an AND operation on an inversion signal of the hold pulse signal V_hold and the second sampling clock signal CK_smpl2. The second up/down counter CNT2 outputs a second duty information DutyInfo2 of the output clock signal CK_out by counting the logic level of the up clock signal V_up and the logic level of the down clock signal V_dn at the edge timing of the second counting clock signal CK_cnt2.

The third logic operator OPc3 outputs a third counting clock signal CK_cnt3 by performing a logic operation on the hold pulse signal V_hold and the third sampling clock signal CK_smpl3. In FIG. 7, the third operator OPc3 outputs the third counting clock signal CK_cnt3 by performing an AND operation on an inversion signal of the hold pulse signal V_hold and the third sampling clock signal CK_smpl3. The third up/down counter CNT3 outputs a third duty information DutyInfo3 of the output clock signal CK_out by counting the logic level of the up clock signal V_up and the logic level of the down clock signal V_dn at the edge timing of the third counting clock signal CK_cnt3.

The adder ADD outputs the duty information DI_add produced by adding the first duty information DutyInfo1, the second duty information DutyInfo2, and the third duty information DutyInfo3 of the output clock signal CK_out. The register REG outputs the digital steer code S_code[n:0] used for adjusting the duty cycle, based the added duty information DI_add. The duty cycle in the case of FIG. 5 is adjusted based on one duty information DutyInfo, whereas in the case of FIG. 7 the duty cycle is adjusted based on three pieces of the duty information DutyInfo1, DutyInfo2 and DutyInfo3. If the duty cycle is adjusted based on much duty information, the duty cycle can be adjusted more accurately and finely. Although three up/down counters CNT1, CNT2 and CNT3 are used in FIG. 7, two up/down counters or four or more up/down counters can also be used.

Figure 8:
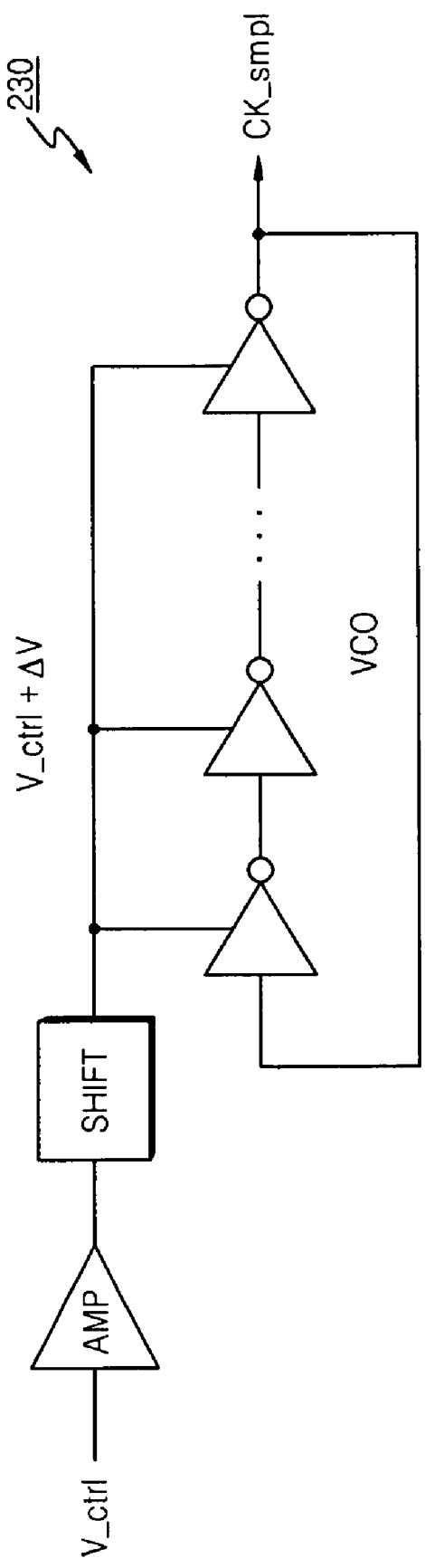
FIG. 8 is an example circuit diagram of a sampling clock generator of FIG. 2.

FIG. 8 is an example circuit diagram of the sampling clock generator 230 of FIG. 2.

Referring to FIG. 8, the sampling clock generator 230 includes an amplifier AMP, a shifter SHIFT, and/or a voltage controlled oscillator VCO.

The amplifier AMP buffers a control signal V_ctrl and outputs the buffered control signal V_ctrl. That is, the amplifier AMP may be a buffer having a unity gain (+1) characteristic. The shifter SHIFT shifts an output signal of the amplifier AMP by a certain delta ($\Delta V$). The voltage controlled oscillator VCO generates the sampling clock signal CK_smpl having a frequency corresponding to an output signal (V_ctrl+$\Delta V$) of the shifter SHIFT. The voltage controlled oscillator VCO is included in the PLL of the system with the DCC 200. Thus, if the voltage controlled oscillator VCO is used in the system, a separate voltage controlled oscillator VCO is not needed.

Generally, the voltage controlled oscillator VCO generates a clock signal having a frequency corresponding to the control signal V_ctrl. Meanwhile, when the frequency of the sampling clock signal CK_smpl intends to be set to a value that is not an integer multiple of the frequency of the output clock signal CK_out, the control signal V_ctrl is shifted by a certain delta ($\Delta V$) using the shifter SHIFT. That is, the shifter SHIFT sets the delta ($\Delta V$) to be not the integer multiple of the frequency of the output clock signal CK_out. The sampling clock signal CK_smpl and the output clock signal CK_out may have a non-harmonic relationship or a harmonic relationship according to the set delta ($\Delta V$).

Figure 9:
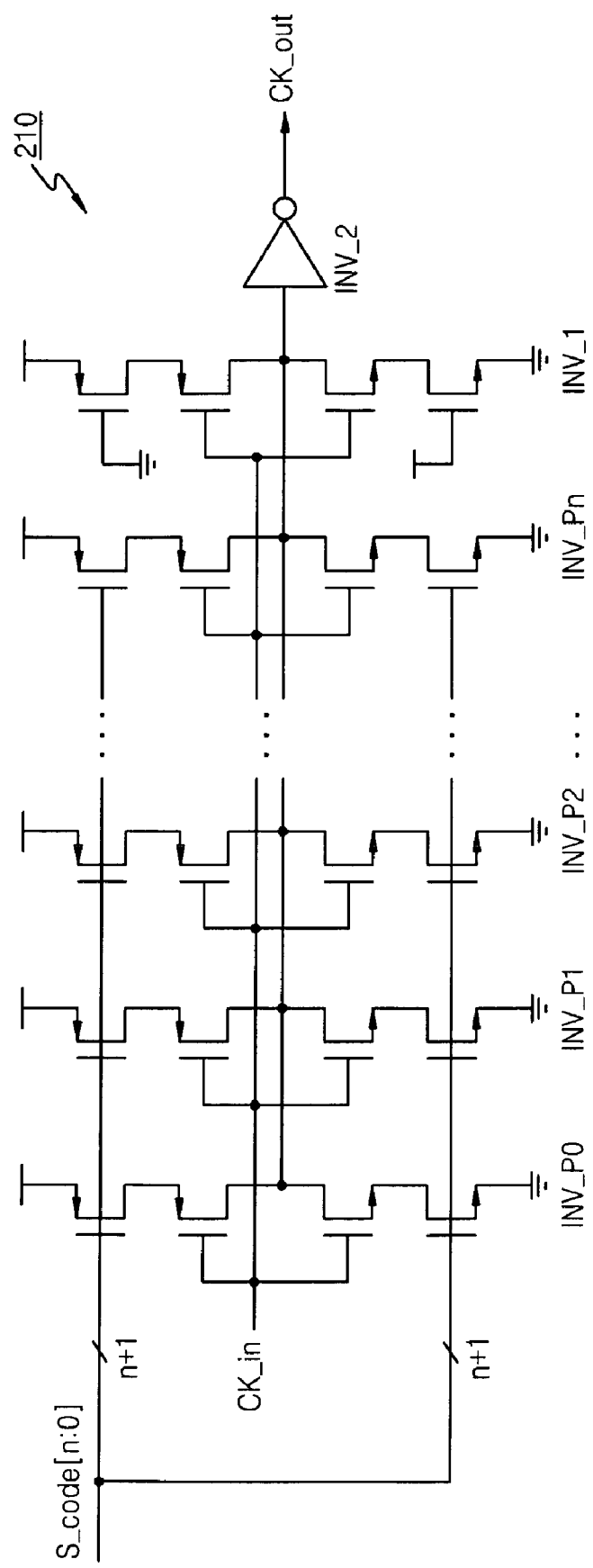
FIG. 9 is an example circuit diagram of the duty steerer of FIG. 12.

FIG. 9 is an example circuit diagram of the duty steerer 210 of FIG. 2.

Referring to FIG. 9, the duty steerer 210 includes a plurality of parallel inverters INV_P0, INV_P1, INV_P2, . . . , INV_Pn responsive to the corresponding digital steer code S_code[n:0], a first inverter INV_1, and a second inverter INV_2.

The input clock signal CK_in is input to the respective input terminals of the parallel inverters INV_P0, INV_P1, INV_P2, . . . , INV_Pn and the input terminal of the first inverter INV_1, and the output clock signal CK_out is output from the output terminal of the second inverter INV_2.

The number of the parallel inverters enabled among the plurality of parallel inverters INV_P0, INV_P1, INV_P2, . . . , INV_Pn is changed according to the digital steer code S_code[n:0]. A rising time, a falling time, or a delay time of the pulses contained in the output clock signal CK_out is changed according to the number of the enabled parallel inverters. If the rising time or the falling time of the respective pulses contained in the output clock signal CK_out is changed, the duty cycle of the output clock signal CK_out is also changed. Consequently, the duty cycle correction according to the digital steer code S_code[n:0] is executed by the above-described steer operation.

Example embodiments may have the following effects.

The duty information of the output clock signal may be detected more accurately because the duty information of the output clock signal is detected based on the counting value accumulated during N period intervals.

The resolution of the duty detector may be increased by increasing the frequency of the sampling clock signal used to detect the duty information of the output clock signal.

The resolution of the duty detector may be increased by detecting the duty information of the output clock signal using the sampling clock signal having the non-harmonic relationship with the output clock signal.

The duty cycle correction for the same input clock signal may be more rapidly performed using the duty information stored in the register when the duty cycle is re-locked.

The duty detector according to example embodiments may reduce or prevent a correction error caused by offset or leakage characteristics because the duty detector is implemented with digital circuits.

When a plurality of duty information is detected from the output clock signal and the duty cycle is corrected using the added duty information, the duty cycle may be corrected more accurately and/or finely.

While example embodiments have been particularly shown and described with reference to FIGS. 1-9, it will be understood by those of ordinary skill in the art that various changes in form and details may be made therein without departing from the spirit and scope of example embodiments as defined by the following claims.

What is claimed is:

1. A duty detector, comprising:
a clock converter receiving a clock signal to generate an up clock signal and a down clock signal having phases opposite to each other;
a hold pulse generator generating a hold pulse signal that is deactivated during a counting interval corresponding to first through (N−1)-th period intervals of the clock signal and is activated during a holding interval corresponding to an N-th period interval of the clock signal;
a first logic operator outputting a counting clock signal by performing a first logic operation on the hold pulse signal and a sampling clock signal; and
an up/down counter determining a logic level of the up clock signal and a logic level of the down clock signal at an edge timing of the counting clock signal, increasing or decreasing a counting value in response to the determination result, and outputting duty information of the clock signal based on a final counting value.

2. The duty detector of claim 1, wherein a frequency of the sampling clock signal is higher than that of the clock signal.

3. The duty detector of claim 1, wherein a frequency of the sampling clock signal is not an integer multiple of a frequency of the clock signal.

4. The duty detector of claim 1, wherein the up/down counter increases or decreases the counting value during the counting interval, and outputs the duty information of the clock signal at the holding interval based on the final counting value.

5. The duty detector of claim 1, wherein the up/down counter increases the counting value when the up clock signal is at a first logic level at the edge timing of the counting clock signal, and decreases the counting value when the down clock signal is at the first logic level at the edge timing of the counting clock signal.

6. The duty detector of claim 5, wherein the up/down counter determines the logic level of the up clock signal and the logic level of the down clock signal at a rising edge timing of the counting clock signal.

7. The duty detector of claim 1, wherein the first logic operator outputs the counting clock signal by performing an AND operation on an inversion signal of the hold pulse signal and the sampling clock signal.

8. The duty detector of claim 1, further comprising a delayer delaying the hold pulse signal by a certain time to output an update signal.

9. The duty detector of claim 8, wherein the up/down counter outputs the duty information of the clock signal in response to an activation of the update signal at the holding interval.

10. The duty detector of claim 9, wherein the update signal is activated at (m×N)-th period interval (where m is a natural number), and the up/down counter updates the duty information of the clock signal at (m×N)-th period interval.

11. The duty detector of claim 1, further comprising a second logic operator outputting a reset signal by performing a second logic operation on the clock signal and the hold pulse signal.

12. The duty detector of claim 11, wherein the second logic operator outputs the reset signal by performing a NAND operation on the clock signal and the hold pulse signal.

13. The duty detector of claim 11, wherein the up/down counter resets the final counting value in response to an activation of the reset signal at the holding interval.

14. The duty detector of claim 1, wherein the up/down counter outputs a sign of the final counting value as the duty information of the clock signal.

15. The duty detector of claim 1, wherein the up/down counter outputs the final counting value as the duty information of the clock signal.

16. The duty detector of claim 1, further comprising a register storing the duty information of the clock signal, and outputting a digital steer code for adjusting a duty cycle of the clock signal based on the stored duty information.

17. A duty detector, comprising:
a clock converter receiving a clock signal to generate an up clock signal and a down clock signal having phases opposite to each other;
a hold pulse generator generating a hold pulse signal that is deactivated during a counting interval corresponding to first through (N−1)-th period intervals of the clock signal and is activated during a holding interval corresponding to an N-th period interval;

a first operator outputting a first counting clock signal by performing a logic operation on the hold pulse signal and a first sampling clock signal;

a first up/down counter outputting a first duty information of the clock signal by counting a logic level of the up clock signal and a logic level of the down clock signal at an edge timing of the first counting clock signal;

a second operator outputting a second counting clock signal by performing a logic operation on the hold pulse signal and a second sampling clock signal; and a second up/down counter outputting a second duty information of the clock signal by counting a logic level of the up clock signal and a logic level of the down clock signal at an edge timing of the second counting clock signal.

18. The duty detector of claim 17, further comprising an adder adding the first duty information and the second duty information of the clock signal and outputting the added duty information.

19. A duty cycle corrector, comprising:

the duty detector of claim 1;

a duty steerer adjusting a duty cycle of an input clock signal in response to the duty information to output the clock signal; and a sampling clock generator generating the sampling clock signal corresponding to a control signal.

20. The duty cycle corrector of claim 19, wherein the sampling clock generator comprises:

an amp buffering the control signal;

a shifter shifting an output signal of the amp by a certain delta; and a voltage controlled oscillator outputting the sampling clock signal having a frequency corresponding to an output signal of the shifter.

21. The duty cycle corrector of claim 20, wherein the shifter sets the delta such that a frequency of the sampling clock signal is not an integer multiple of a frequency of the clock signal.

* * * * *